United States Patent
Xie

(10) Patent No.: US 9,595,623 B1
(45) Date of Patent: Mar. 14, 2017

(54) PCSS-BASED SEMICONDUCTOR DEVICE, SWITCHING DEVICE, AND METHOD

(71) Applicant: Chenggang Xie, Marion, IA (US)

(72) Inventor: Chenggang Xie, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 343 days.

(21) Appl. No.: 14/192,197

(22) Filed: Feb. 27, 2014

(51) Int. Cl.
*H01L 31/02* (2006.01)
*H01L 31/0224* (2006.01)

(52) U.S. Cl.
CPC .......................... *H01L 31/022466* (2013.01)

(58) Field of Classification Search
CPC ................ H01L 31/09; H01L 31/022466
See application file for complete search history.

(56) References Cited

U.S. PATENT DOCUMENTS

| | | | |
|---|---|---|---|
| 4,149,108 A * | 4/1979 | Chang | H01J 29/182 313/391 |
| 5,028,971 A | 7/1991 | Kim et al. | |
| 5,155,352 A | 10/1992 | Kim et al. | |
| 5,574,464 A | 11/1996 | Madonna et al. | |
| 5,804,815 A | 9/1998 | Loubriel et al. | |
| 6,248,992 B1 * | 6/2001 | Baca | H01L 31/09 250/214 LS |
| 7,173,295 B1 * | 2/2007 | Mar | H01L 31/125 257/233 |
| 2004/0240777 A1 * | 12/2004 | Woodgate | G02B 27/2214 385/16 |

* cited by examiner

*Primary Examiner* — Tony Ko
(74) *Attorney, Agent, or Firm* — Daniel M. Barbieri; Donna P. Suchy; Angel N. Gerdzhikov

(57) ABSTRACT

A present novel and non-trivial semiconductor device, switch device and method performed by the switch device is disclosed. A semiconductor device for conducting current may be comprised of an SI substrate and a plurality of electrodes deposited upon the substrate, where at least one electrode may be comprised of a transparent conductive material ("TCM"). A switching device may be comprised of a plurality of electromagnetic radiation sources and a plurality of the semiconductor devices. The method performed by the switching device may be comprised of receiving a plurality of cycles. During a first cycle, a first semiconductor device may be irradiated, and in response, current may flow through the first semiconductor device and provided to a user circuit. During the second cycle, a second semiconductor device may be irradiated, and in response, current from a user circuit may be received and flow through the first semiconductor device.

20 Claims, 3 Drawing Sheets

Pros: Low Contact Resistance
High Conversion Energy

Pro: High Conversion Energy
Con: High Contact Resistance

Pro: Low Contact Resistance
Con: Low Conversion Efficiency

Pros: Low Contact Resistance
      High Conversion Energy

PCSS-BASED SEMICONDUCTOR DEVICE, SWITCHING DEVICE, AND METHOD

BACKGROUND OF THE INVENTION

Field of the Invention

This invention relates to semiconductor switches and, more particularly, a photoconductive semiconductor switch (singularly, "PCSS").

Description of the Related Art

A PCSS may be an electric switch that is based upon the photoconductivity of a material and controlled by light via photon-induced conductivity. Photoconductivity may be considered an optical and electrical phenomenon in which a material becomes more electrically conductive due to an absorption of electromagnetic radiation when irradiated. Where photon energy is sufficient enough to raise electrons above the band gap energy, free electrons are generated and electrical current flows. As number of free electrons and electron holes in the material increases, conductivity increases.

Many materials possessing favorable photoconductive properties are available in the design of PCSSs. Materials such as chromium-doped gallium arsenide ("GaAs") (collectively, "Cr—GaAs"), low-temperature grown gallium arsenide ("LT-GaAs"), indium phosphide ("InP"), amorphous silicon, and gallium nitride ("GaN") possess favorable photoconductive properties. Photoconductive materials may serve as semi-insulating ("SI") substrates in the design of PCSSs.

Known to those skilled in the art, a PCSS may fall into one of two categories: a lateral PCSS and a vertical PCSS. A generic representation of a lateral PCSS comprised of a semi-insulating ("SI") substrate 102 and metallic electrodes 104 and being irradiated with a laser pulse 106 is shown in FIG. 1A. Similarly, a generic representation of a vertical PCSS comprised of a dielectric 108, an SI substrate 110, and metallic electrodes and being irradiated with a laser pulse 112 is shown in FIG. 1B (only the top metallic electrode 114 is shown, whereas a bottom metallic electrode 116 opposite of the top metallic electrode 114 is hidden from view).

PCSSs may be used in high-power applications requiring, for instance, greater than 10 kilovolts and 10 kiloamps. In addition, PCSSs may be used in directed energy applications such as pulsed power generation, ultra wideband radar, and arbitrary waveform generation, and scaled to provide a near ideal isolated radio frequency ("RF") switch. PCSS turn-on times of 10 picoseconds may be obtainable and optimized with turn-off times of 10 picoseconds. With transitioning times of nearly zero, PCSSs operating in power devices comprised of binary switches improve class-D amplifiers.

Although PCSSs possess favorable properties in high-power applications, unfavorable properties may exist during the employment of lateral PCSSs comprised of metallic electrodes. Although lateral PCSSs demonstrate high energy conversion efficiency when subjected to front side irradiation (such as shown in FIG. 1A), high electrode resistance is present directly underneath the electrodes. When subjected to back side irradiation, low energy conversion efficiency is demonstrated along with low electrode resistance.

BRIEF SUMMARY OF THE INVENTION

A present novel and non-trivial photoconductive semiconductor device and complementary system and method is disclosed. With the embodiments disclosed herein, at least one electrode comprised of a transparent conductive material ("TCM") may be employed to expose each shadow zone of the SI substrate of the photoconductive semiconductor device to electromagnetic radiation, where each shadow zone is comprised of an adjacent side of the SI substrate adjacent to each electrode (e.g., underneath each electrode).

In one embodiment, a semiconductor device for conducting current is disclosed, where the semiconductor device may be comprised of an SI substrate and a plurality of electrodes deposited upon the substrate. The substrate may be comprised of a channel and at least one shadow zone. The channel may be located between the electrodes, and each shadow zone may be comprised of an adjacent side, and the adjacent side of each shadow zone may be located adjacent to one electrode. Each electrode may be comprised of a TCM through which the adjacent side may be irradiated.

In another embodiment, a switching device for conducting current is disclosed, where the switching device may be comprised of a plurality of electromagnetic radiation sources and a plurality of the semiconductor devices. Each electromagnetic radiation source may be configured to irradiate one semiconductor device, where each electromagnetic radiation source may be configured to receive one cycle of current from a source of current configured to generate a plurality of cycles. As embodied herein, the source of current could be a pulse-width modulator.

In another embodiment, a method performed by the switching device is disclosed, where the method may be comprised of receiving a plurality of cycles. During a first cycle, a first semiconductor device may be irradiated, and in response, current may flow through the first semiconductor device and provided to a user circuit. During the second cycle, a second semiconductor device may be irradiated, and in response, current from a user circuit may be received and flow through the first semiconductor device.

DETAILED DESCRIPTION OF THE INVENTION

In the following description, several specific details are presented to provide a thorough understanding of embodiments of the invention. One skilled in the relevant art will recognize, however, that the invention can be practiced without one or more of the specific details, or in combination with other components, etc. In other instances, well-known implementations or operations are not shown or described in detail to avoid obscuring aspects of various embodiments of the invention.

Figure 1A:
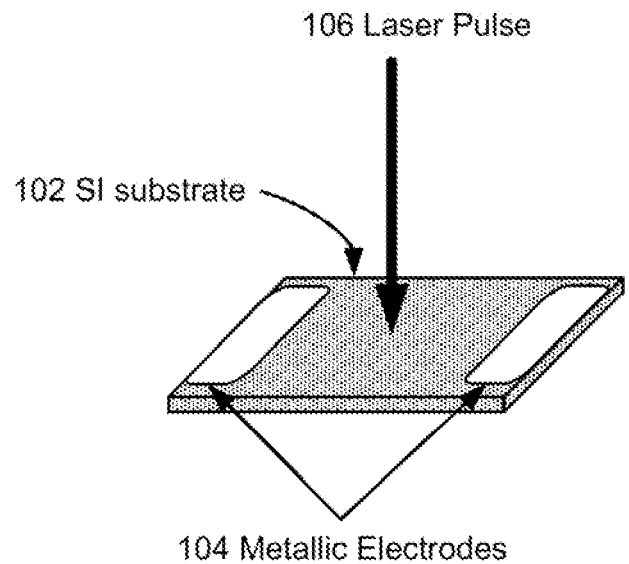
FIG. 1A depicts a generic representation of a lateral PCSS.
Figure 1B:
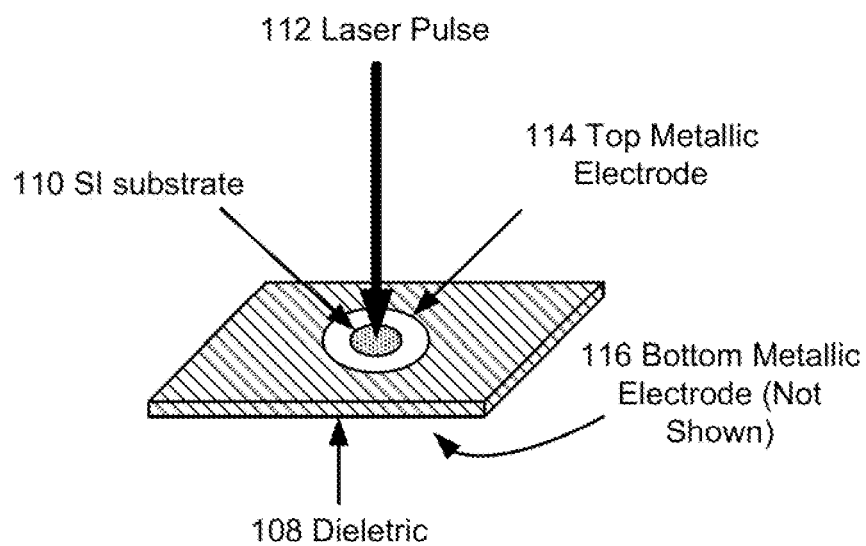
FIG. 1B depicts a generic representation of a vertical PCSS.
Figure 2A:
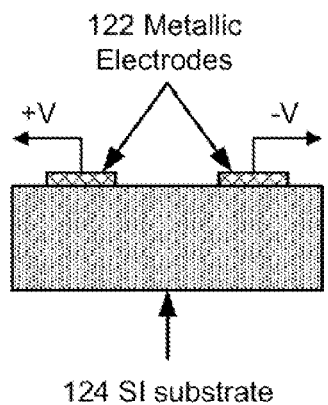
FIG. 2A presents a side view of a lateral PCSS.

Referring to FIG. 2A, a side view of the lateral photoconductive semiconductor switch ("PCSS") comprised of metallic electrodes 122 deposited on an SI substrate 124 is illustrated. For the purpose of discussion and not of limitation, the metallic electrodes 122 may be comprised of any metal, alloy (e.g., gold/nickel or gold/germanium/nickel alloys), or the like through which electromagnetic radiation may not pass to the semi-insulating ("SI") substrate 124.

Figure 2B:
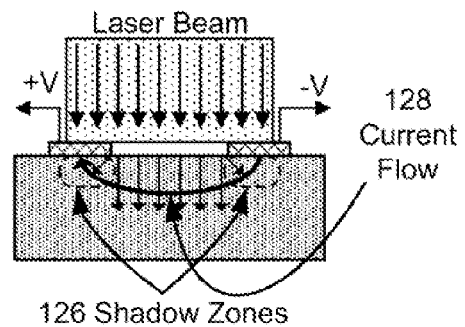
FIG. 2B presents a lateral PCSS being subjected to front side illumination.

Referring to FIG. 2B, the lateral PCSS of FIG. 2A is being subjected to front side irradiation of electromagnetic radiation which, for the purpose of illustration, is comprised of a laser beam of a laser diode (e.g., green laser diode emitting at 530 nanometers). For the purpose of illustration and not of limitation, the channel width could be 500 micrometers, the channel depth could be 20 micrometers, the active depth of generated free electrons could be two to three times the channel length, and the SI substrate could be comprised of gallium nitride ("GaN"), where the channel is the area in between the electrodes as shown in FIG. 2C (the drawings herein are not drawn to scale).

Returning to FIG. 2A, the electromagnetic radiation of the laser beam is being absorbed by the SI substrate in between the metallic electrodes. To a lesser extent, the electromagnetic radiation is absorbed and dispersed throughout the shadow zones 126 of the SI substrate underneath each metallic electrode, where one side of each shadow zone 126 could be comprised of the front side of the SI substrate underneath each metallic electrode. The amount of photon energy dispersed within the shadow zones 126 is dissipated; in other words, there exists an increase of electrode (i.e., contact) resistance due to the displacement of photon energy. As a result of the generation of free electrons induced by the irradiation, a current flow 128 from one metallic electrode to the other is created but attenuated due to electrode resistance.

Figure 2C:
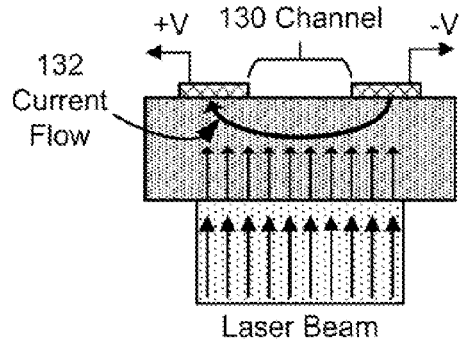
FIG. 2C presents a lateral PCSS being subjected to back side illumination.

Referring to FIG. 2C, the lateral PCSS of FIG. 2A is being subjected to back side irradiation of electromagnetic radiation. In FIG. 2C, the electromagnetic radiation of the laser beam is being absorbed by the SI substrate in between and underneath the metallic electrodes. Experiments have indicated that a lateral GaN PCSS subjected to back side irradiation exhibits lower conversion efficiency outside of a channel 130, where the channel 130 may be defined as the zone located in between the electrodes; that is, the participation of free electrons outside of the channel is lower than the lateral PCSS being subjected to front side irradiation. As a result of the generation of free electrons induced by the irradiation, a current flow 132 from one metallic electrode to the other is created but attenuated due to low conversion efficiency.

Figure 3:
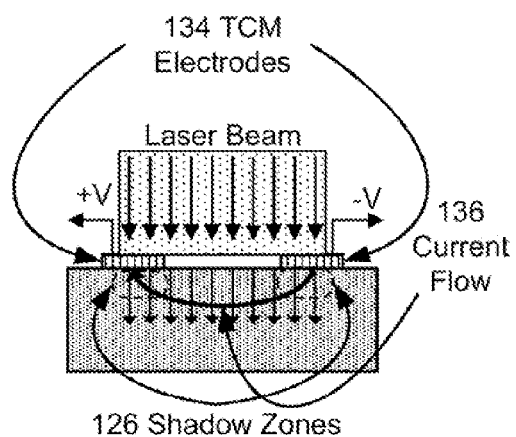
FIG. 3 presents a lateral PCSS with electrodes comprised of a transparent conductive material.

Referring to FIG. 3, the metallic electrodes of the lateral PCSS of FIG. 2A have been replaced with electrodes comprised of transparent conductive material(s) (singularly, "TCM") that allow the electromagnetic radiation to pass through the electrodes to the shadow zones 126, exposing the adjacent side of the substrate underneath each electrode to direct exposure of electromagnetic radiation; that is, the adjacent side of each shadow zone 126 is directly irradiated by pass-through radiation. As a result of the direct exposure of the substrate underneath each TCM electrode 134 to pass-through radiation, electrode resistance decreases as the amount of photon energy absorbed by the SI substrate increases, resulting in an increase of current flow 136 while maintaining a relatively high conversion efficiency.

As embodied herein, the TCM may be a material that is both optically transparent and electrically conductive. Materials which include these properties include, but are not limited to, indium tin oxide ("ITO"), indium oxide, tin oxide, zinc oxide, aluminum-doped zinc oxide, and cadmium oxide. The selection of material could depend upon TCM properties and compatibility. Properties by which TCMs are compared include resistivity and transmittance; for example, ITO possesses a low resistivity of approximately 0.0001 ohms-centimeter and a high transmittance of greater than 80 percent, but transmittance falls quickly when subjected to near 400 nanometers ("nm"). ITO may be compatible if subjected to electromagnetic radiation produced by a green laser diode but not 410 nm (e.g., violet blue laser diode).

It should be noted that, although the discussion above has been drawn towards two TCM electrodes, the embodiments herein do not exclude the ability to combine one metallic electrode with one TCM electrode; moreover, although the discussion above has been drawn to a lateral PCSS, the embodiments do not exclude a vertical PCSS.

Figure 4:
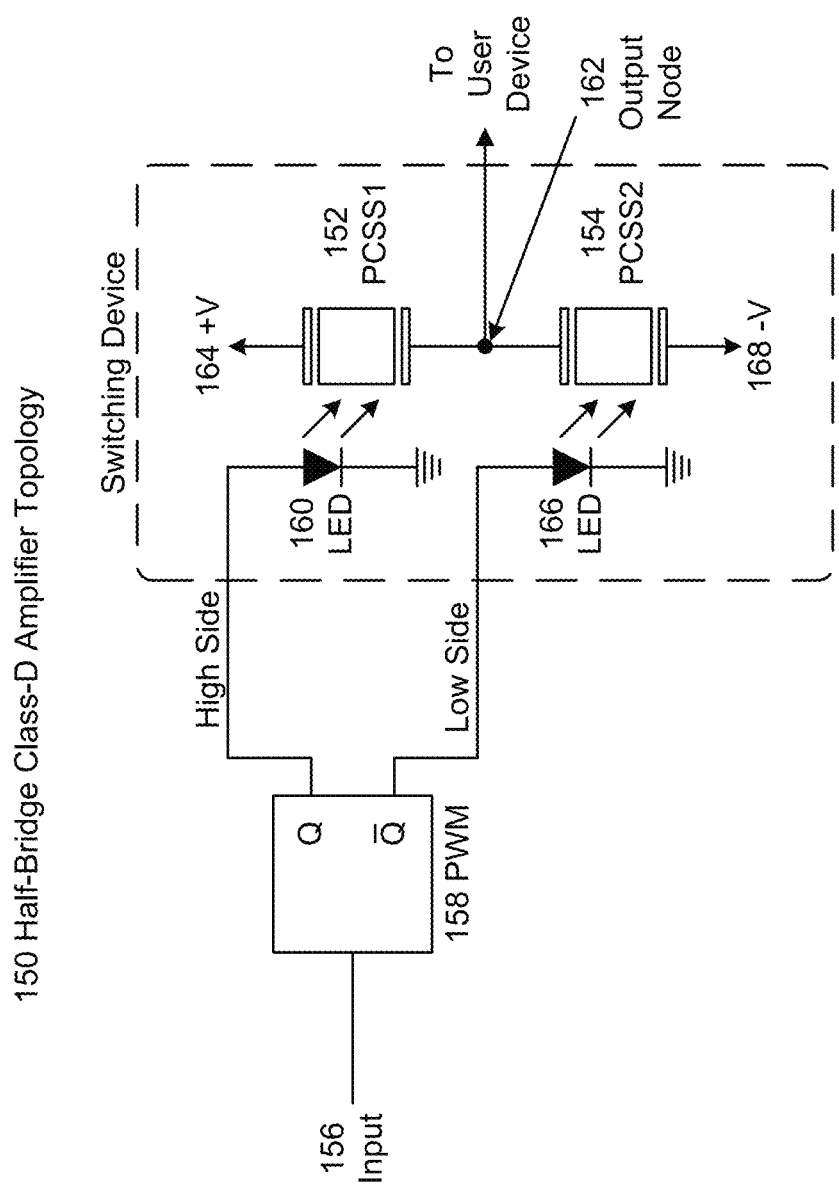
FIG. 4 presents an exemplary simplified topology of a half-bridge Class-D amplifier.

Referring to FIG. 4 and for the purpose of illustration and not of limitation, an exemplary simplified topology of a half-bridge Class-D amplifier 150 employing lateral PCSSs with TCM electrodes (PCSS1 152 and PCSS2 154) is presented. Those skilled in the art understand that there are different topologies of a class-D amplifier which perform the same function and provide the same output as the topology of FIG. 4. A signal may be received as input 156 to a pulse-width modulator ("PWM") 158, which produces a PWM cycle comprised of a positive cycle (i.e., high side) and negative cycle (i.e., low side). As the positive cycle begins, high side output produced by the PWM 158 is used to switch on LED 160 and irradiate (i.e., turn on) PCSS1 152. Once PCSS1 152 is turned on, the output node 162 is connected to +V 164 and current flowing through PCSS1 152 begins to increase and provided to a user circuit until the positive cycle ends. When the negative cycle begins, low side output produced by the PWM 158 is used to switch on LED 166 and irradiate PCSS2 154. Once PCSS2 154 is turned on, the output node 162 is connected to −V 168 and current flowing from the user circuit through PCSS2 154 begins to increase until the negative cycle ends. At the completion of one cycle, the waveform produced by PWM 158 on both the high and low sides is amplified.

As used herein, the term "embodiment" means an embodiment that serves to illustrate by way of example but not limitation.

It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

What is claimed is:

1. A semiconductor device, comprising:
a semi-insulating ("SI") substrate comprised of a channel, a front side, and a plurality of zones; and
a plurality of electrodes deposited upon the front side of the SI substrate, where
the channel is located between the plurality of electrodes,
each zone one of the plurality of zones is located outside of the channel and underneath and contiguous with one electrode of the plurality of electrodes,
one electrode of the plurality of electrodes is comprised of an optically transparent and electrically conductive material ("TCM"), such that an application of electromagnetic radiation striking the one electrode from above passes through the one electrode, thereby irradiating the zone underneath and contiguous with the one electrode.

2. The semiconductor device of claim 1, wherein
the channel becomes irradiated when exposed to the application of electromagnetic radiation, thereby inducing a flow of current between the plurality of electrodes.

3. The semiconductor device of claim 1, wherein the irradiation of the zone underneath and contiguous with the one electrode results in a reduction of electrode resistance than if the one electrode has been comprised of a metallic electrode.

4. The semiconductor device of claim 1, wherein
the one electrode is a first electrode, and
a second electrode of the plurality of electrodes is comprised of a TCM, such that
an application of electromagnetic radiation striking the second electrode from above passes through second one electrode, thereby
irradiating the zone underneath and contiguous with the second electrode.

5. The semiconductor device of claim 4, wherein the irradiation of the zone underneath and contiguous with the second electrode reduces electrode resistance than if the second electrode has been comprised of a metallic electrode.

6. A switching device, comprising:
a plurality of electromagnetic radiation sources; and
a plurality of semiconductor devices, where
each source of the electromagnetic radiation sources is configured to irradiate one semiconductor device, and
each device of the semiconductor devices is comprised of:
a semi-insulating ("SI") substrate comprised of a channel, a front side, and a plurality of zones, and
a plurality of electrodes deposited upon the front side of the SI substrate, where
the channel is located between the plurality of electrodes,
each zone of the plurality of zones is located outside of the channel and underneath and contiguous with one electrode of the plurality of electrodes, and
one electrode of the plurality of electrodes is comprised of an optically transparent and electrically conductive material ("TCM"), such that
an application of electromagnetic radiation striking the one electrode from above passes through the one electrode, thereby
irradiating the zone underneath and contiguous with the one electrode.

7. The switching device of claim 6, wherein
the channel becomes irradiated when exposed to the application of electromagnetic radiation, thereby inducing a flow of current between the plurality of electrodes.

8. The switching device of claim 6, wherein the irradiation of the zone underneath and contiguous with the one electrode results in a reduction of electrode resistance than if the one electrode has been comprised of a metallic electrode.

9. The switching device of claim 6, wherein
the one electrode is a first electrode, and
a second electrode of the plurality of electrodes is comprised of a TCM, such that
an application of electromagnetic radiation striking the second electrode from above passes through second one electrode, thereby
irradiating the zone underneath and contiguous with the second electrode.

10. The switching device of claim 9, wherein the irradiation of the zone underneath and contiguous with the second electrode reduces electrode resistance than if the second electrode has been comprised of a metallic electrode.

11. The switching device of claim 6, further comprising:
a source of current comprised of a plurality of cycles, where
a first electromagnetic radiation source of the plurality of electromagnetic radiation sources is configured to receive a first cycle of the plurality of cycles from the source of current, and
a second electromagnetic radiation source of the plurality of electromagnetic radiation sources is configured to receive a second cycle of the plurality of cycles from the source of current.

12. The switching device of claim 11, wherein the source of current comprised of a plurality of cycles is a pulse-width modulator.

13. The switching device of claim 11, wherein
the first electromagnetic radiation source irradiates a first semiconductor device of the plurality of semiconductor devices in response to receiving the first cycle, and
the second electromagnetic radiation source irradiates a second semiconductor device of the plurality of semiconductor devices in response to receiving the second cycle.

14. The switching device of claim 6, further comprising:
an output node configured to:
receive current from a first semiconductor device of the plurality of semiconductor devices in response to an irradiation of the first semiconductor device, and
provide current to a second semiconductor device of the plurality of semiconductor devices in response to an irradiation of the second semiconductor device.

15. A method performed by a switching device, comprising:
receiving a first cycle of current, where
a first semiconductor device of a plurality of semiconductor devices is irradiated by an electromagnetic radiation source; and
receiving a second cycle of current, where
a second semiconductor device of a plurality of semiconductor devices is irradiated by an electromagnetic radiation source, where
the first semiconductor device and the second semiconductor device are each comprised of:
a semi-insulating ("SI") substrate comprised of a channel, a front side, and a plurality of zones, and
a plurality of electrodes deposited upon the front side of the SI substrate, where
the channel is located between the plurality of electrodes,
each zone of the plurality of zones is comprised of a side located outside of the channel and underneath one electrode of the plurality of electrodes, and
one electrode of the plurality of electrodes is comprised of an optically transparent and electrically conductive material ("TCM"), such that electromagnetic radiation striking the one electrode from above passes through the one electrode, thereby
irradiating the zone underneath and contiguous with the one electrode.

16. The method of claim 15, wherein
the channel becomes irradiated when exposed to the application of electromagnetic radiation, thereby
inducing a flow of current between the plurality of electrodes.

17. The method of claim 15, wherein the irradiation of the zone underneath and contiguous with the one electrode results in a reduction of electrode resistance than if the one electrode has been comprised of a metallic electrode.

18. The method of claim 15, wherein
the one electrode is a first electrode, and
a second electrode of the plurality of electrodes is comprised of a TCM, such that
an application of electromagnetic radiation striking the second electrode from above passes through second one electrode, thereby
irradiating the zone underneath and contiguous with the second electrode.

19. The method of claim 18, wherein the irradiation of the zone underneath and contiguous with the second electrode reduces electrode resistance than if the second electrode has been comprised of a metallic electrode.

20. The method of claim 15, further comprising:
providing current to a user circuit in response to the irradiation of the first semiconductor device, and
receiving current from the user circuit in response to the irradiation of the second semiconductor device.

* * * * *